United States Patent [19]

Arimoto et al.

[11] Patent Number: 5,130,766
[45] Date of Patent: Jul. 14, 1992

[54] QUANTUM INTERFERENCE TYPE SEMICONDUCTOR DEVICE

[75] Inventors: Hiroshi Arimoto, Yokohama; Shunichi Muto, Atsugi; Shigehiko Sasa; Makoto Okada, both of Isehara; Naoki Yokoyama, Atsugi, all of Japan

[73] Assignee: Fujitsu Limited, Kawasaki, Japan

[21] Appl. No.: 389,265

[22] Filed: Aug. 3, 1989

[30] Foreign Application Priority Data

Aug. 4, 1988 [JP] Japan .............................. 63-195666
Nov. 14, 1988 [JP] Japan .............................. 63-287058

[51] Int. Cl.$^5$ .............................................. H01L 29/80
[52] U.S. Cl. ............................................ 357/22; 357/4; 357/16
[58] Field of Search ..................... 357/16, 22 A, 22 J, 357/22 I, 22 F, 4 SL, 15, 20, 58

[56] References Cited

U.S. PATENT DOCUMENTS

| | | | |
|---|---|---|---|
| 3,643,237 | 2/1972 | Anacker | 357/4 |
| 4,257,055 | 3/1981 | Hess et al. | 357/4 |
| 4,525,730 | 6/1985 | Beha et al. | 357/4 |
| 4,550,330 | 10/1985 | Fowler | 357/16 |
| 4,704,622 | 11/1987 | Capasso et al. | 357/16 |
| 4,733,282 | 3/1988 | Chang et al. | 357/16 |
| 4,745,452 | 5/1988 | Sollner | 357/30 E |
| 4,780,749 | 10/1988 | Schulman | 357/16 |
| 4,806,998 | 2/1989 | Vinter et al. | 357/22 A |
| 4,942,437 | 7/1990 | Fowler et al. | 357/22 A |
| 4,957,337 | 9/1990 | Ogawa et al. | 357/4 |
| 5,003,360 | 3/1991 | Okada et al. | 357/16 |

FOREIGN PATENT DOCUMENTS

| | | | |
|---|---|---|---|
| 61-159769 | 1/1985 | Japan | 357/16 |
| 63-093161 | 10/1986 | Japan | 357/22 |

OTHER PUBLICATIONS

Morkoc, "Observation . . . Quantum Well", Appl. Phys. Lett. 49(2), Jul. 14, 1986.
International Electron Devices Meeting, 1986, "A Novel Quantum Interference Transistor (QUIT) With Extremely Low Power-Delay Product and Very High Transconductance", by S. Bandyopadhyay et al, pp. 76-79; IEEE, New York.
IEEE Electron Device Letters, vol. EDL-6, No. 12, Dec. 1985, "Resonant Tunneling Transistors with Controllable Negative Differential Resistances", by A. R. Bonnefoi et al., pp. 636-638, IEEE, New York.
Applied Physics Letters, vol. 47, No. 12, Dec. 1985, American Institute of Physics, Woodbury, New York, "Resonant Tunneling of Two-Dimensional Electrons Through a Quantum Wire; A Negative Transconductance Device", by S. Luryi et al, pp. 1347-1349.
"Novel Interference Effects between Parallel Quantum Wells"; S. Datta et al., Physical Review Letters, vol. 5, No. 21, Nov. 18, 1985; pp. 2344-2347.
"Proposed structure for large quantum interference effects"; S. Datta et al.; Applied Physics Letter 48; Feb. 17, 1986; pp. 487-489.
"A Novel Quantum Interference Transistor (QUIT) with Extremely Low Power-Delay Product and Very High Transconductance"; S. Bandyopadhyay et al.; IEDM 1986 Tech. Dig.; pp. 76-79.

Primary Examiner—Rolf Hille
Assistant Examiner—Minh Loan Tran
Attorney, Agent, or Firm—Staas & Halsey

[57] ABSTRACT

A quantum interference type semiconductor device is composed of at least one bifurcated branch conductive channel with a heterojunction in a semiconductor with a band discontinuity that produced a potential well between two semiconductor regions into which a carrier is injected and from which a carrier is drained, at least one gate electrode is arranged at the side of the one bifurcated branch conduction channel, and a kind of filter using a resonance tunneling barrier arranged before or upstream of the semiconductor region into which a carrier is injected. The filter passes a carrier having a certain energy legvel to the channel whereby the level of the carrier traveling in the channel becomes equal to realize a good quantum interference effect.

20 Claims, 9 Drawing Sheets

QUANTUM INTERFERENCE TYPE SEMICONDUCTOR DEVICE

BACKGROUND OF THE INVENTION

1. The present invention relates to a quantum interference type semiconductor device having a bifurcated branch conductive channel with a heterojunction in the semiconductor with a band discontinuity.

2. Description of the Related Art

Recently, according to the rapid developments in electronic apparatus such as electronic computers, a high-speed semiconductor device is required. Under this condition, a very-high-speed quantum interference type semiconductor device having a heterostructure is proposed. In such a device, a quantum interference effect of wave functions of an electron at the heterojunction between semiconductor materials with different band gaps, for example, a heterojunction between an undoped GaAs layer and an undoped AlGaAs layer wherein a two-dimensional electron gas layer is produced, is used.

In conventional quantum interference type semiconductor devices having a bifurcated branch conductive channel with a heterojunction in the semiconductor with a band discontinuity for controlling a conductance of the channel by controlling a phase difference of the wave functions of an electron traveling in the channel, the following conditions are necessary to realize a good quantum interference:

① The energy of electrons injected to the channel should be equal;

② An inelastic scattering of wave functions of an electron traveling in the channel should be prevented.

In order to realize the condition of ②, a distance between a source and a drain must be less than or equal to 1 μm.

SUMMARY OF THE INVENTION

The object of the present invention is to provide a quantum interference type semiconductor device having good quantum interference characteristics by making the energy level of the electrons uniform using the resonance tunneling barrier sutructure. The other object of the present invention is to provide a quantum interference type semiconductor device whose distance between the source electrode and the drain electrode is less than or equal to 1 μm.

According to the present invention, the resonance tunneling barrier structure functions as a bandpass filter having a high quality factor Q for passing electrons having a certain narrow energy level range into the channel, so that the traveling speed of the electrons in the channel due to the energy level becomes uniform and the dispersion of the phase difference becomes slight thereby realizing a good quantum interference. Further, according to the present invention, the distance between the source electrode and the drain electrode is made to be less than or equal to 1 μm by forming the source electrode, the resonance tunneling barrier structure, the channel, and the drain electrode in this order on the semiconductor substrate, and a drain current flows perpendicular to the semiconductor substrate, so that the inelastic scattering of wave functions of an electron traveling in the channel is prevented.

BRIEF DESCRIPTION OF THE DRAWINGS

The present invention will be more clearly understood from the description below with reference to the accompanying drawings, wherein.

DESCRIPTION OF THE PREFERRED EMBODIMENTS

Before describing the preferred embodiments of the present invention, an explanation will be given of the conventional quantum interference effect using a quantum interference effect element model such as a semiconductor functional element known as a semiconductor interferometer shown in FIG. 1, and characteristic curves shown in FIGS. 2 and 3.

Figure 1:
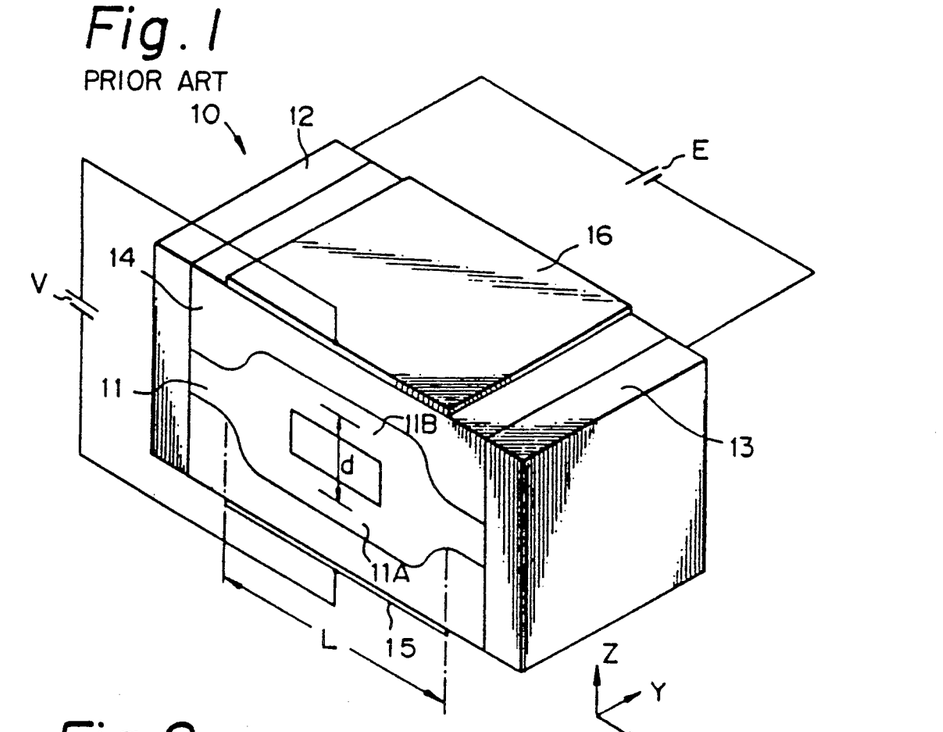
FIG. 1 is a schematic illustration of a quantum interference effect element model for explaining a quantum interference effect.

The quantum interference effect element shown in FIG. 1 is constructed similar to the semiconductor interferometer shown in U.S. Pat. No. 4,550,330, issued Oct. 29, 1985, to Alan B. Fowler et al., disclosing that "An interferometer is constructed by providing a bifurcated branch conductive path coplanar with a heterojunction in a semiconductor with a band discontinuity that produces a potential well so that electron wave conduction at the heterojunction can be locally influenced with an electric field applied to one branch of the bifurcated path." Further, developments and research on the quantum interference effect are now proceeding, for example, see "S. Datta et al. Phys. Rev. Lett. 55 1985 p. 2344", "S. Datta et al. Appl. Phys. Lett. 48 1986 p. 487", and "S. Bandyopadhyay et al IEDM-86 Tech. Dig. p. 76".

In FIG. 1, reference numeral 10 indicates a quantum interference effect element, 11 indicates a channel made of GaAs where electrons travel, 11A and 11B indicate a bifurcated branch conductive path, 12 indicates an input contact, 13 indicates an output contact, 14 indicates a nonconductive layer made of AlGaAs which forms a "barrier" as compared with a "well", 15 and 16 indicate electrodes, L indicates the length of a bifurcated branch path, and E and V indicate power sources.

In a quantum interference effect element as constructed above, when a signal is provided at the input contact 12, wave functions of an electron are divided into two groups at the bifurcated point of the channel 11. One group of wave functions of an electron travels in a branch path 11A and the other group of wave functions of an electron travels in a branch path 11B, both groups of wave functions of an electron are then added together after traveling through the path 11A and 11B and arriving at the output contact 13. In this process, when the electric field is applied to the paths 11A and 11B by connecting the electrodes 15 and 16 to the power source V or the magnetic field perpendicular to the paths 11A and 11B is applied, a wave function of electrons in the paths 11A and 11B is influenced by the local electric field or magnetic field and a phase shift occurs according to the potential of the field thereby causing a wave inteference when the two groups of electron's wave function are added together. In other words, the amount of phase shift of the electron's wave function is different in the path 11A and the path 11B when the electric or magnetic field is applied thereby causing a phase difference between the electron's wave function in the paths 11A and 11B. The transmission factor due to the wave interference is expressed as shown in Equation 1 using a conductance G.

$$G = G_o(1 + [\cos \phi]) \qquad 1$$

where $2_{Go}$ is the conductance when there is no wave interference (cos $\phi = 1$), parentheses ([]) are the ensemble average of electrons, and $\phi$ is the phase difference value in the wave function of electrons due to the application of the electric field or the magnetic field.

The phase difference value $\phi$ when the electric field is applied is expressed as shown in Equation 2 as a function of $\epsilon_z$ (electrostatic Aharonov-Bohm effect).

$$\phi = e^* \epsilon_z {}^*L {}^*d/n {}^*Vx \qquad 2$$

where e is an elementary quantity of an electric charge, $\epsilon_z$ is an electric field applied to the branch paths 11A and 11B in the direction of Z, L is the length of the branch paths 11A and 11B, d is a distance between the center of the branch paths 11A and 11B, n is a Planck's constant, and Vx is a traveling speed of the electrons. As explained above, the phase difference value can be controlled by changing the strength of the electric field applied to the branch paths 11A and 11B, thereby controlling the conductance G. In this way, the conductance G alternates as a function of the phase difference $\phi$.

Figure 2:
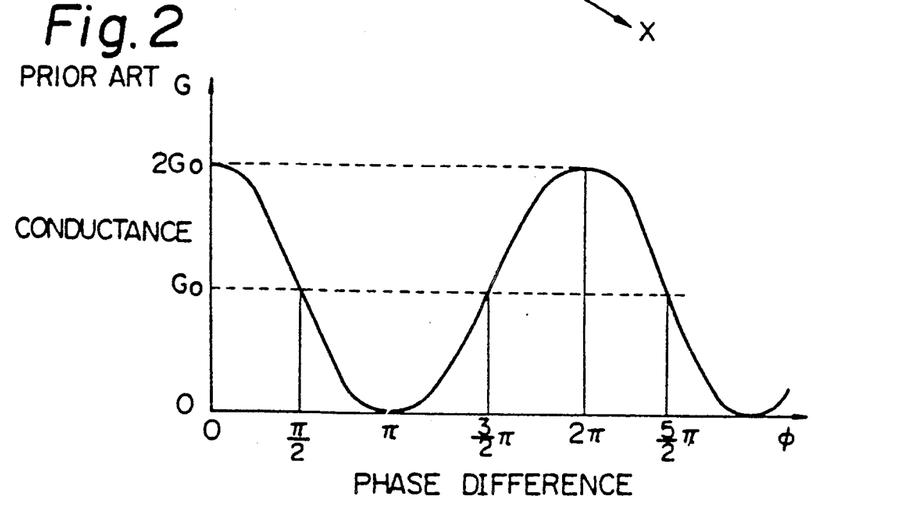
FIG. 2 is a chart for explaining the characteristics of changes in the conductance and phase difference in each branch conductive path in FIG. 1.

FIG. 2 is a chart for explaining the characteristics of change of the conductance G (vertical axis) and the phase difference $\phi$ (horizontal axis) in each branch path 11A and 11B. FIG. 3 shows waveforms for explaining the operation of the signal applied at the input contact 12 of the semiconductor functional element 10 shown in FIG. 1.

Figure 3A:
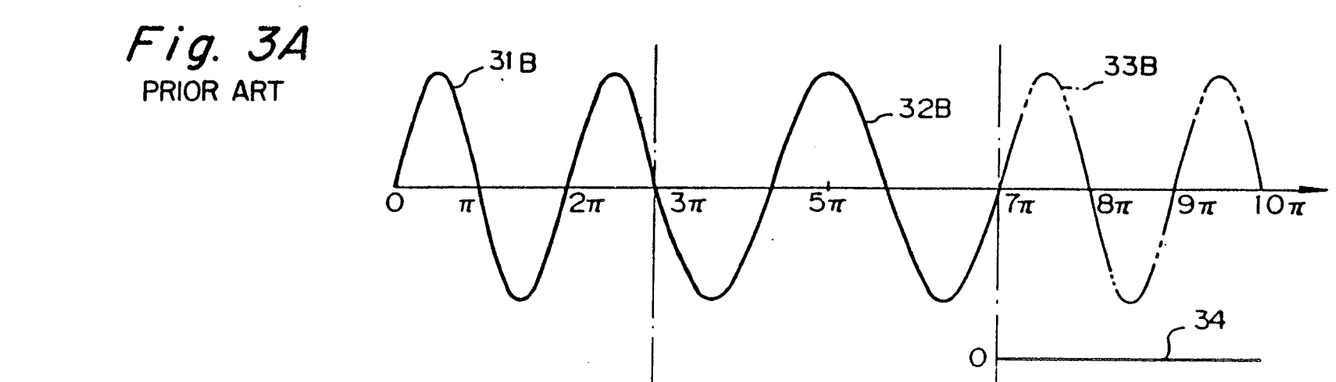
FIG. 3 shows waveforms for explaining the operation of the signal applied at an input contact of the element shown in FIG. 1.
Figure 3B:
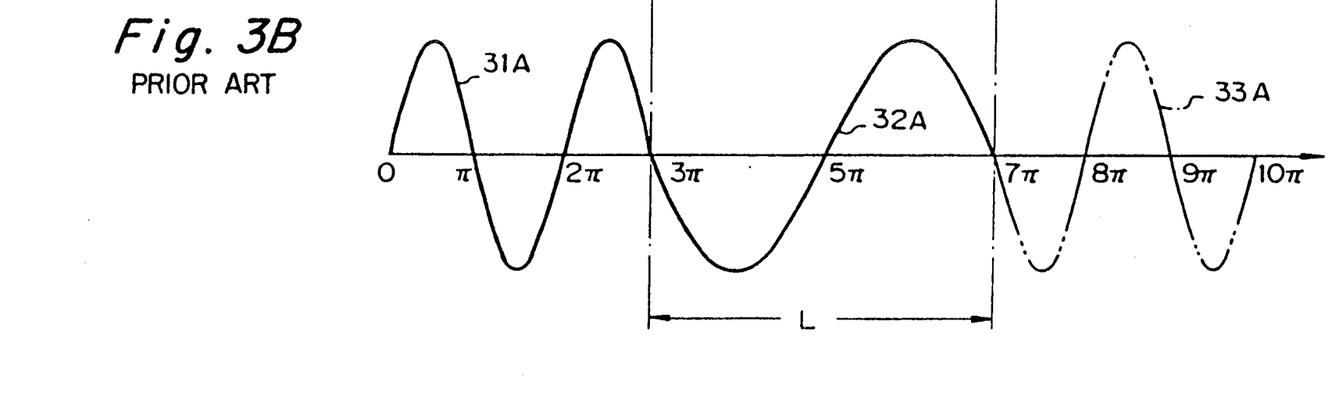

In FIG. 3, reference numerals 31A and 31B indicate waveforms of the signal traveling in the channel 11 before the branch paths 11A and 11B, 32A indicates a waveform of the signal traveling in the branch path 11A, 32B indicates a waveform of the signal traveling in the branch path 11B, 33A and 33B indicate the phantom waveforms of the signal in the channel 11 after the branch paths 11A and 11B when two signals exist without being added together, and 34 indicates a real output signal from the output contact 13 after the addition of the two waveforms 33A and 33B. In this embodiment, the phase of the signal traveling in the branch path 11A is shifted $2\pi$, and in the branch path 11B is shifted $\pi$ by adjusting the strength of the electric field applied to the element 10 in order to cancel the output signal.

In this way, the quantum interference effect in the conventional semiconductor functional element shown in FIG. 1 changes not only by the parameter $\epsilon_z$ of an electric field applied to the branch paths 11A and 11B in the direction of Z, but also by the parameter Vx of the traveling speed of the electrons. Accordingly, if the traveling speed Vx of the electron is dispersing, that is, if the energy level of the electron is dispersing, the phase difference value $\phi$ in Equation 2 also disperses thereby causing the variation degree $\Delta G$ of the conductance to become small. If the value $\Delta G/G$ is not large enough, the function as an active device becomes less so that the energy level of the electrons traveling in the path should be equal.

Figure 4:
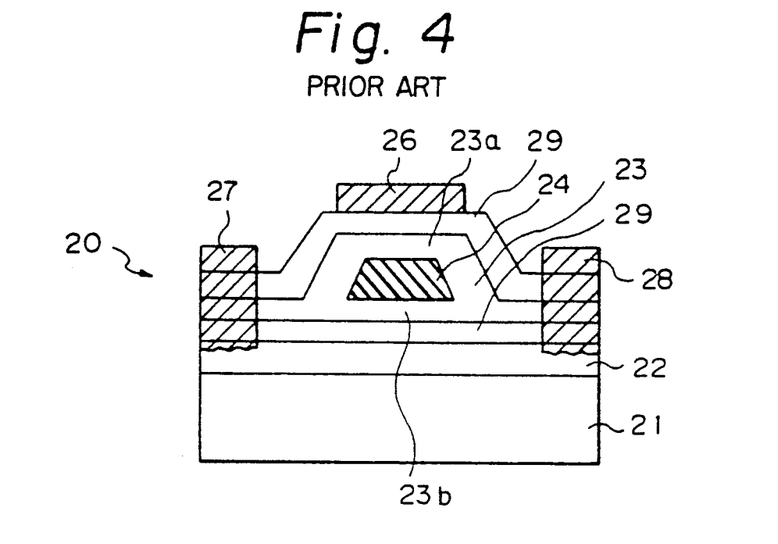
FIG. 4 is a cross sectional view of a conventional quantum interference transistor.

FIG. 4 shows a cross sectional view of a conventional quantum interference transistor. In FIG. 4, reference numeral 20 indicates a quantum interference transistor, 21 indicates a semiconductor substrate, 22 indicates a buffer layer, 23 indicates a channel, 24 indicates a channel separator, 26 indicates a gate electrode, 27 indicates a source electrode, 28 indicates a drain electrode, and 29 indicates a high resistance layer. The channel separator 24 and the high registance layer 29 are for example, made of n-type AlGaAs. The channel 23 is for example made of GaAs, and having a heterojunction structure against the high resistance layer 29 wherein a two-dimensional electron gas layer is produced at the GaAs side of the interface of the n-type AlGaAs layer. The channel 23 is bifurcated into two paths 23a and 23b by the separator 24 and the gate electrode 26 is arranged beside the path 23a to change the conductance of the paths 23a and 23b by applying the electric field.

Incidentally, contact regions of the source electrode 27 and the drain electrode 28 form an $n^+$ region having a relatively large dimension, and further, a current flowing between the source electrode 27 and the drain electrode 28 is principally parallel to the semiconductor substrate 21. As a result, it is very difficult to form the thickness of each layer of the path 23a, the channel separator 24, and the path 23b to be less than or equal to 0.1 $\mu$m, and to shorten the distance between the source electrode 27 and the drain electrode 28 less than or equal to 1 $\mu$m.

Contrary to this, in the quantum interference type semiconductor device described hereinafter according to the present invention, the energy level of the electrons traveling in the path should be equal. Further, in the quantum interference type semiconductor device wherein the channel is formed vertically on the semiconductor substrate according to the present invention, the distance between the source electrode 27 and the drain electrode 28 is less than or equal to 1 μm.

Figure 5A:
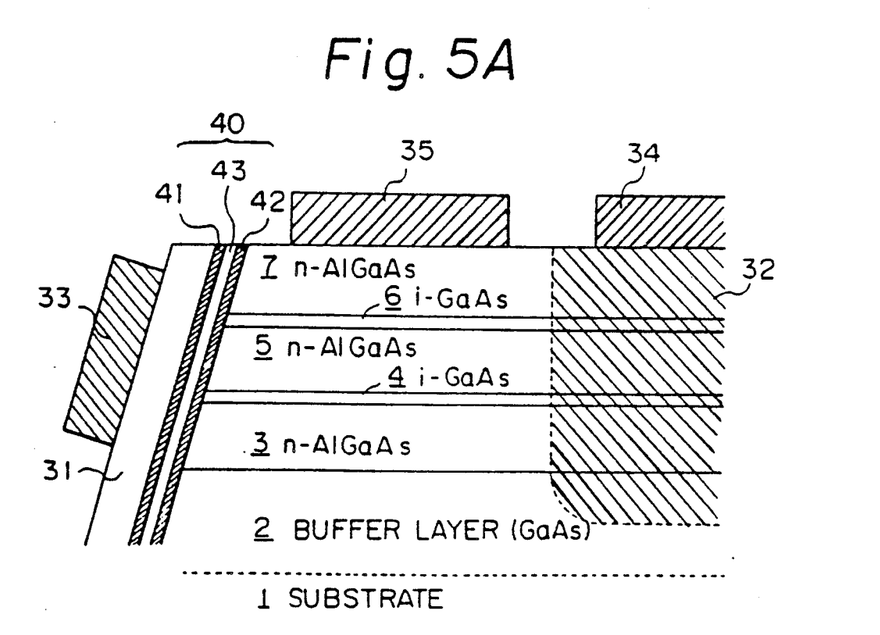
FIG. 5A is a cross sectional view of a first embodiment of a quantum interference type semiconductor device according to the present invention.
Figure 5B:
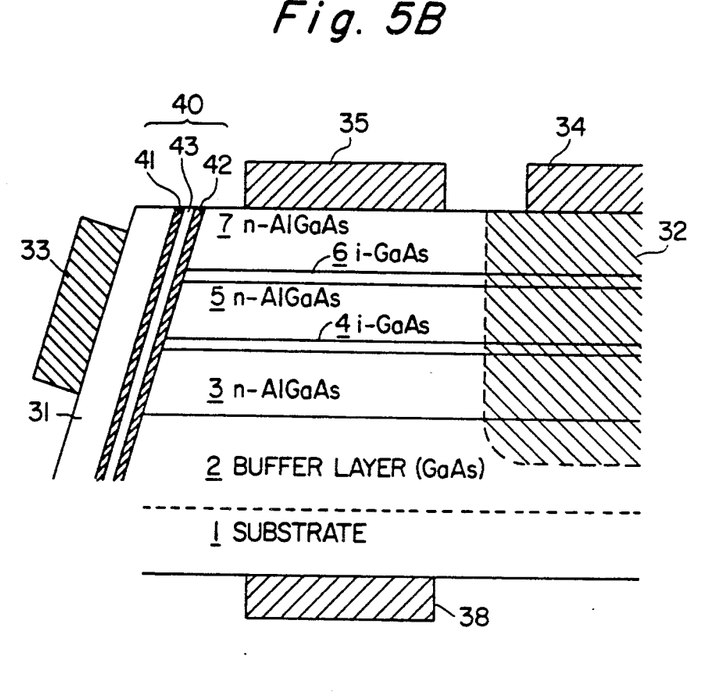
FIG. 5B is a cross sectional view of the first embodiment of the quantum interference type semiconductor device having gate electrodes on both sides of the device.

FIG. 5 is a cross sectional view of a first embodiment showing a typical construction of a quantum interference type semiconductor device according to the present invention. In FIG. 5, reference numeral 1 denotes a substrate made of mono-crystal, 2 denotes a buffer layer of GaAs, 3 denotes a first n-AlGaAs layer, 4 denotes a first i-GaAs layer, 5 denotes a second n-AlGaAs layer, 6 denotes a second i-GaAs layer, 7 denotes a third n-AlGaAs layer, 31 denotes a source contact layer, 32 denotes an alloy region for ohmic contact called a drain contact region formed by the diffusion of impurities, 33 denotes a source electrode, 34 denotes a drain electrode, 35 denotes a gate electrode, 38 denotes a gate electrode 40 denotes a resonance tunneling barrier comprising a first barrier layer 41, a second barrier layer 42, and a well layer 43.

The quantum interference type semiconductor device of the first embodiment is formed by using an epitaxial crystal constructed by the following process.

① First, the buffer layer 2 of GaAs is grown on the mono-crystal substrate 1 made of GaAs, then n-AlGaAs layers 3,5 and 7 and undoped i-GaAs layers 4 and 6 are epitaxially grown in turn on the substrate 1 with a MOCVD method or a molecular beam epitaxy (MBE) method. Note that the i-GaAs layers 4 and 6 are current paths which correspond to the branch paths 11A and 11B in FIG. 1, and these layers 4 and 6 are conductive by receiving electrons from n-AlGaAs layers located on both sides thereof in this embodiment, though the branch paths 11A and 11B by themselves have conductivity due to a heterostructure of the bands. Also, the thickness of the i-GaAs layers 4 and 6 are design matters.

② Second, etching of the side of the epitaxial crystal formed as described above is carried out and an inclined plane is made whereon a resonance tunneling structure will be formed. The reason for forming the inclined plane is that the object of the processing is the epitaxial crystal having a wafer condition. If a processing method which can grow a certain crystal on the perpendicular plane is adopted, the side shape of the epitaxial crystal should not be inclined but should be perpendicular. For the etching method, a Cl₂ gas etching method in which an ultraviolet light of approximately 250 nm in wave length is irradiated in the etching process, can be used. This etching method is suitable for forming an inclined plane since it shows an anisotropy due to a plane direction, and this method does not cause any mechanical damage to an element forming region.

③ Third, forming a resonance tunneling barrier layer having the first tunneling barrier layer 41, the well layer 43, and the second tunneling barrier layer 43 on the inclined plane, is carried out. In the resonance tunneling barrier, the well layer 43 having a several nanometer thickness and made of GaAs is sandwiched in between two barrier materials 41 and 42 having a similar thickness and made of a material having a wider band gap than GaAs, such as AlGaAs. It is suitable to form the resonance tunneling barrier structure which is a super-lattice structure, by the atomic layer epitaxy which provides a material having a repeated self-limiting effect with a predetermined time unit. The number of atomic layers included in each layer is decided according to the element design.

④ Fourth, forming of the source contact layer 31 by growing the $_n{}^+$-GaAs epitaxially on the resonance tunneling barrier and then forming a source electrode 33 made of Cr/Au on the source contact layer 31 (non-alloy contact layer using $_n{}^+$-InGaAs cap layer) by evaporation or the like, are carried out. On the other hand, the drain contact region 32 is formed as the alloy region for an ohmic contact by the diffusion of impurities, and the drain electrode 34 made of AuGe/Au material is arranged next to the drain contact region 32. Further, the gate electrode 35 for applying a control voltage to the bifurcated electron paths 4 and 6 is formed on the surface of the third n-AlGaAs layer 7. This gate electrode 35 forms a Schottky barrier against the third n-AlGaAs layer 7 and is made of Al, for example. According to the voltage applied to the gate electrode 35, the phase difference in the bifurcated paths 4 and 6 is controlled.

Figure 6A:
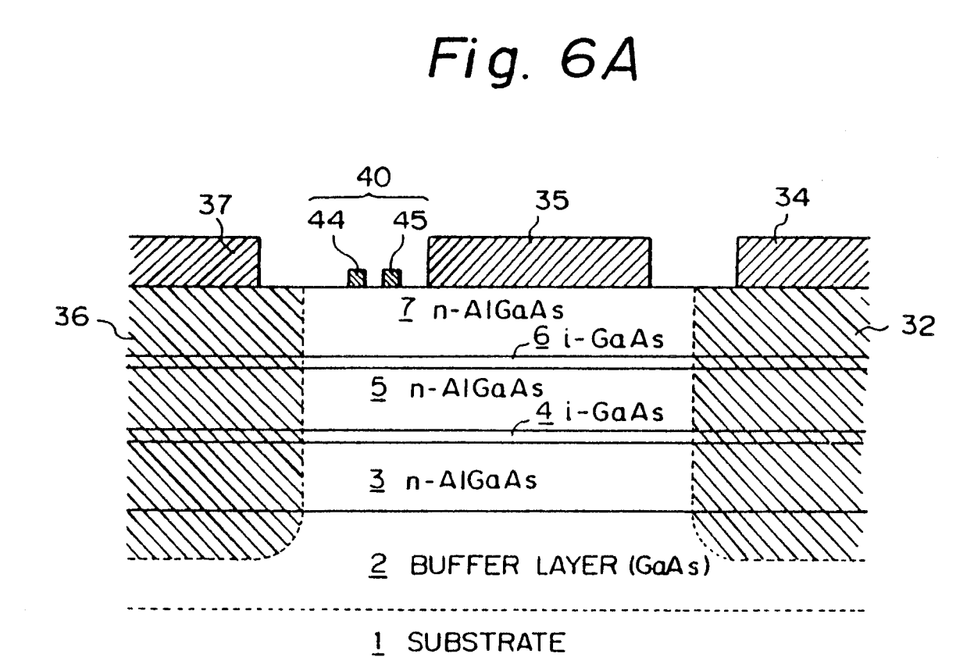
FIG. 6A is a cross sectional view of a second embodiment of a quantum interference type semiconductor device according to the present invention.
Figure 6B:
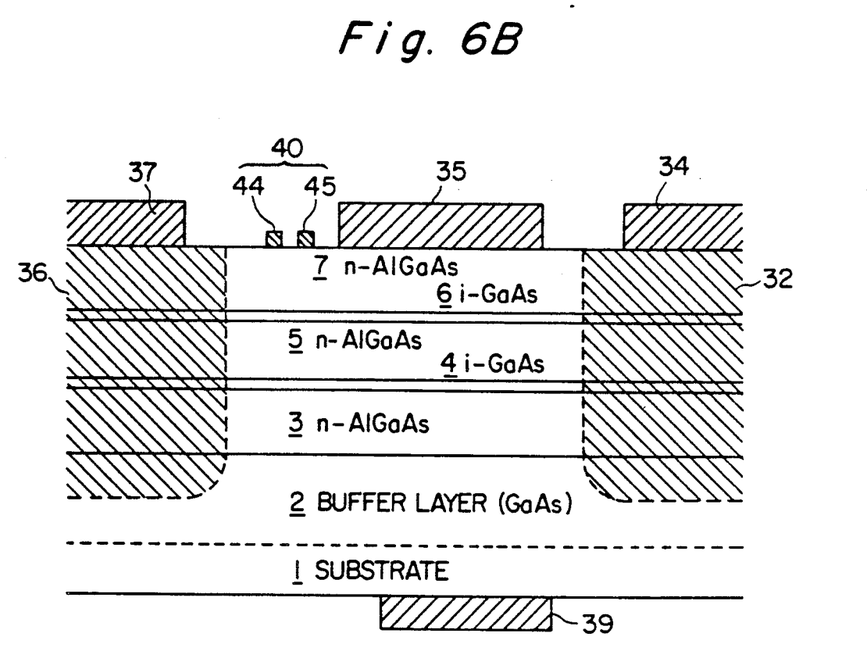
FIG. 6B is a cross sectional view of the second embodiment of the quantum type semiconductor device having gate electrodes on both sides of the device.

Additionally, the resonance tunneling barrier 40 can be formed by another method such as applying a partial voltage to the bifurcated paths 4 and 6 using resonance tunneling electrodes. This method is shown in FIG. 6 as the second embodiment of the present invention. In FIG. 6, most of the structure is the same as the structure shown in FIG. 5, so that for the same structure, the same reference numerals are used, and the explanation thereof will be omitted. In FIG. 6, reference numeral 36 denotes a source contact region formed as the alloy region for an ohmic contact by the diffusion of impurities, 37 denotes a source electrode, 34 made of AuGe/Au material 39 denotes a gate electrode, and 40 denotes a resonance tunneling barrier comprising two lines of resonance tunneling electrodes 44 and 45 of Schottky-barrier-type arranged on the surface of the third n-AlGaAs layer 7 between the gate electrode 35 and the source contact region 36 perpendicular to the bifurcated paths 4 and 6.

In this embodiment, when the bias voltage is applied to the resonance tunneling electrodes 44 and 45, the potential under the resonance tunneling electrodes 44 and 45 is changed and an effective resonance tunneling barrier will be formed, so that the traveling speed of the electrons downstream of the resonance tunneling electrodes 44 and 45 becomes uniform.

Figure 7A:
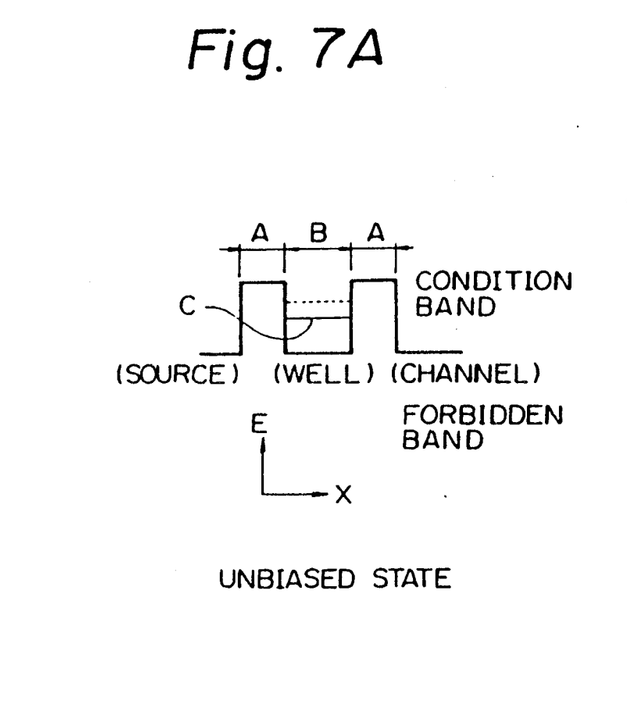
FIG. 7A shows an energy band of a resonance tunneling barrier in an unbiased state.
Figure 7B:
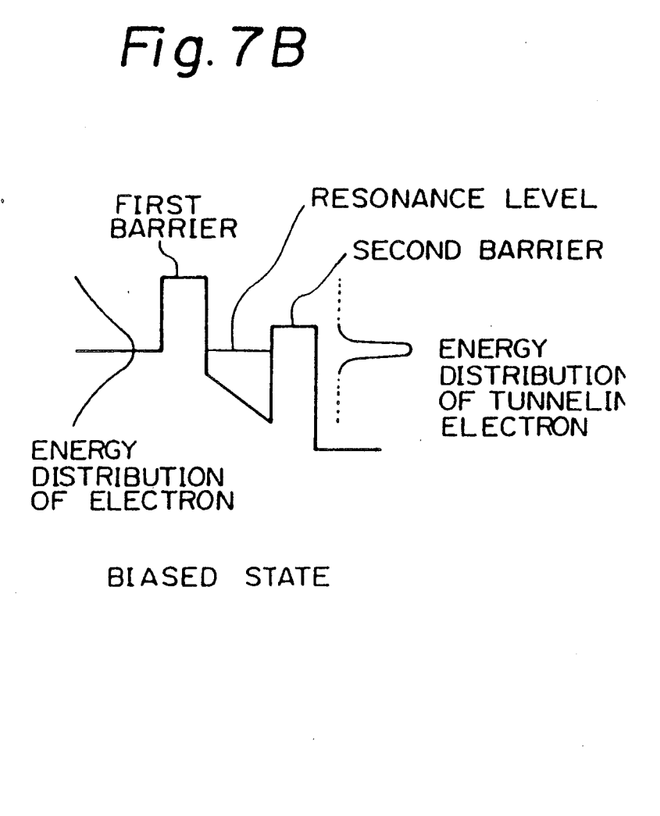
FIG. 7B shows an energy band of a resonance tunneling barrier in a biased state.

FIGS. 7A and 7B are energy band diagrams for explaining a function of the resonance tunneling barrier according to the present invention. FIG. 7A shows an unbiased state of the energy band of the resonance tunneling barrier wherein the bias voltage in X direction is not applied. In FIG. 7A, reference A denotes a semiconductor region having a wider forbidden band, B denotes a semiconductor region having a narrower forbidden band, and C denotes a resonance level. The semiconductor region near the source electrode is called a first barrier and the semiconductor region near the drain electrode is called a second barrier.

Under the condition that the semiconductor region B is sandwiched in between two semiconductor regions A in the unbiased state, a standing wave of the electron occurring in the electron well (semiconductor region B) lies between the barriers (semiconductor region A) from the view point of the conduction band. When the bias voltage in X direction is applied, in other words when an electric field in X direction is applied, the energy band alternates as shown in FIG. 7B, and when the energy level of the standing wave and the lower level of the conduction band become equal, the tunneling probability of electrons having the same energy level as the lower level of the conduction band approaches "1", while the tunneling probability of electrons having other energy levels approaches "0".

Namely, the resonance tunneling barrier functions as a band-pass filter having a very high quality factor Q which can pass the electrons being resonant with the quantum well. Accordingly, in a biased state, among the group of electrons having a wide-spread energy level due to the heat as shown at the left part of FIG. 7B, only the group of electrons having an energy level equal to the resonance level C can pass through the first and the second barriers as shown at the right part in FIG. 7B. Theoretically, some means having the same filtering function as the resonance tunneling barrier, or some means being able to make a phase of the wave function of the electrons even, can be substituted for the resonance tunneling barrier.

Figure 8:
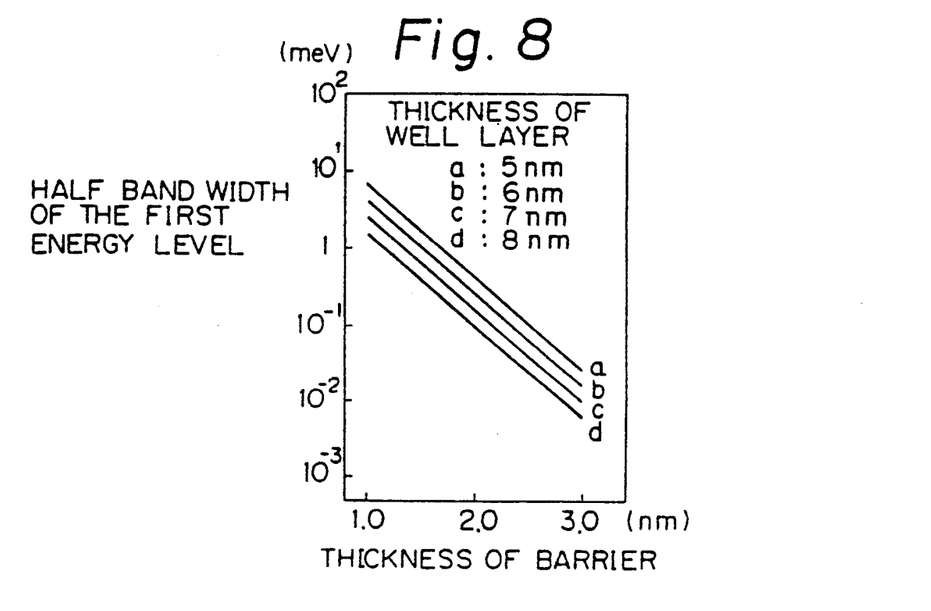
FIG. 8 is a diagram showing a relation between a thickness of a barrier and a half band width of the first energy level.

FIG. 8 is a diagram showing a relation between the thickness of the barrier forming the quantum well and a half band width $\Delta E$ of the energy level of the lowest order of the standing wave reported by M. Tsuchiya et al. (Applied Electronic Materials Meeting Research Report, No. 410, p. 25). In FIG. 8, references a, b, c, and d denote parameters showing the thickness of the well layer. The value $\Delta E = 30 \sim 60$ $\mu$eV realized by providing the resonance tunneling barrier in the quantum interference type semiconductor device is small enough in comparison with the heat energy at room temperature, and also smaller in one figure as compared with the heat energy of 0.36 meV at 4.2K, so that the deviation of the injected energy due to the heat at the Fermi plane can be ignored.

Figure 9:
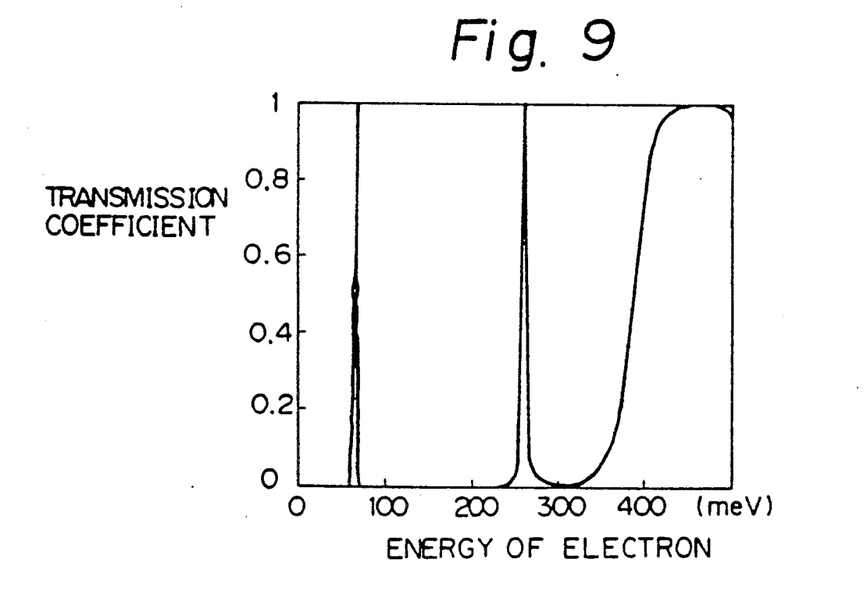
FIG. 9 is a diagram showing a relation between an energy of an electron and a transmission coefficient.

FIG. 9 is a diagram showing a relation between the energy of the electrons and a transmission coefficient. FIG. 9 shows that the standing waves existing in the quantum well are not only of a first degree but also of a high order (the peak level at 65 meV is due to the first degree of the resonance level and at 260 meV is due to the second degree thereof). The ratio of the traveling speed $V_1$ and $V_2$ of electrons injected with those of the first and second degree of the energy level is expressed as shown in the following equation 3.

$$V_1/V_2 = (269 meV/65 meV)^{\frac{1}{2}} = 2 \qquad 3$$

According to the equation 2, the phase difference caused by the same control voltage $\epsilon_z$ becomes $\frac{1}{2}$ and the cycle of the conductance G becomes twice as large. In this way, by providing the resonance tunneling barrier at the injection part of the semiconductor device, it is possible to change the characteristics of the element by selecting the working condition of the device without changing the dimensions of the element as an additional effect.

Figure 10A:
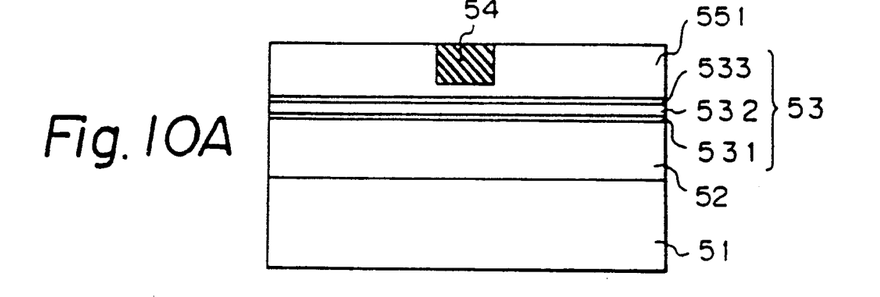
FIGS. 10A and 10B are cross sectional views showing the manufacturing process of a third embodiment of the quantum interference type semiconductor device according to the present invention.
Figure 10B:
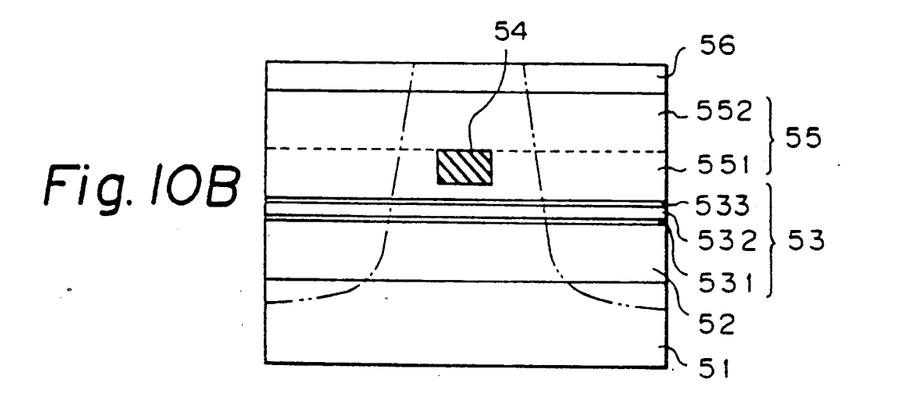
Figure 10C:
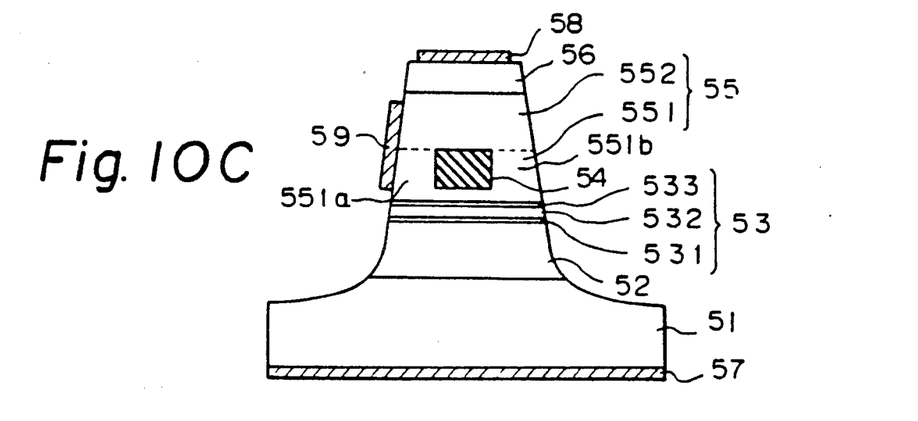
FIG. 10C is a cross sectional view of a third embodiment of a quantum interference type semiconductor device according to the present invention.

FIG. 10C is a cross sectional view of a third embodiment of the quantum interference type semiconductor device according to the present invention. In FIG. 10C, reference numeral 51 denotes a semiconductor substrate, 52 denotes a buffer layer called a source contact layer, 53 denotes a resonance tunneling barrier comprising a first barrier layer 531, a quantum well layer 532, and a second barrier layer 533, 54 denotes a channel separator, 55 denotes a channel comprising a first channel layer 551 and a second channel layer 552, 56 denotes a drain contact layer, 57 denotes a source electrode, 58 denotes a drain electrode, and 59 denotes a gate electrode. Further, the first channel 551 is separated into two paths 551a and 551b by the channel separator 54.

FIGS. 10A and 10B show a manufacturing process of the quantum interference type semiconductor device as shown in FIG. 10C. The manufacturing process of the quantum interference type semiconductor device will be described hereinafter.

First, the buffer layer 52, the resonance tunneling barrier 53 having the first barrier layer 531, the quantum well layer 532 and the second barrier layer 533, and the first channel layer 551 are laminated in this order on the semiconductor layer 51 by means of the molecular beam epitaxy (MBE) method. One example of the composition and the thickness of each layer is shown as follows.

| semiconductor | | substrate | 51 | $n^+$-GaAs | |
|---|---|---|---|---|---|
| buffer layer (Si doped $1 \times 10^{17}$ cm$^{-3}$) | | | 52 | n-GaAs | 2000 Å |
| first barrier layer | | | 531 | i-AlGaAs | 11.3 Å |
| quantum well layer | | | 532 | i-GaAs | 198 Å |
| second barrier layer | | | 533 | i-AlGaAs | 11.3 Å |
| first channel layer (Si doped $1 \times 10^{17}$ cm$^{-3}$) | | | 551 | n-GaAs | 2000 Å |

Second, the channel separator 54 having a width of 0.2 $\mu$m, a depth of 0.15 $\mu$m from the surface, and a dose amount of $1 \sim 5 \times 10^{14}$ cm$^{-2}$ in the first channel layer 551 is formed by means of maskless ion injection of fluorine ion (B$^+$) using a focusing ion beam having an accelerating voltage of 40 keV and a diameter of 0.1 $\mu$m. This channel separator 54 has a high-resistance and prevents electrons from invading therein.

Third, the second channel layer 552 and the drain contact layer 56 are laminated in this order on the first channel layer 551 by means of the molecular beam epitaxy (MBE) method. One example of the composition and the thickness of each layer is shown as follows.

| second channel layer (Si doped $1 \times 10^{17}$ cm$^{-3}$) | 552 | n-GaAs | 2000 Å |
|---|---|---|---|
| drain contact layer (Si doped $5 \times 10^{18}$ cm$^{-3}$) | 56 | $n^+$-AlGaAs | 1000 Å |

The channel 55 is composed of the first channel layer 551 and the second channel layer 552 having the same composition and the channel 55 is separated into two paths 551a and 551b by the channel separator 54. The electrons having traveled through the channel 55 flow in to the drain contact layer 56.

Fourth, etching in the form of mesa as shown by the phantom line in FIG. 10B, maintaining the top surface of the structure to be a square shape whose four sides are 0.4 $\mu$m in length respectively, is carried out. Then the gate electrode 59 is formed on one side of the channel 55, a source electrode 57 is formed on the lower surface of the semiconductor substrate 51, and the drain electrode 58 is formed on the top surface of the drain contact layer 56.

In this way, in the quantum interference type semiconductor device of the third embodiment, the channel 55 for the flow of drain current is formed in a direction perpendicular to the semiconductor substrate 51 so that it is possible to shorten the distance between the source electrode 57 and the drain electrode 58, for example, if the device is formed by using the molecular beam epitaxy method, the distance between the source electrode 57 and the drain electrode 58 can be less than or equal to 0.1 μm. When the distance between the source electrode 57 and the drain electrode 58 is short, the chance of the inelastic scattering of wave functions of an electron traveling in the channel is decreased thereby increasing the interference effect.

Figure 11:
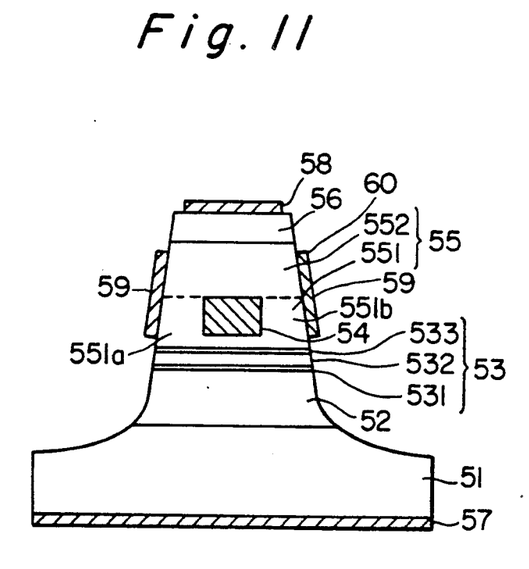
FIG. 11 is a cross sectional view of the third embodiment of the quantum interference element having a common electrode.

FIG. 11 is the same as FIG. 10 except that a common electrode 60 is provided on a side of the channel and faces the gate electrode 59.

Note that, more than one gate electrode can be arranged beside the channel, more than one channel can be made in the semiconductor device, and a common electrode facing the gate electrode can be arranged on the other side of the channel in above described embodiments, though they are not shown.

We claim:

1. A quantum interference type semiconductor device using an Aharonov-Bohm effect comprising:
   a first semiconductor layer into which a carrier is injected;
   a second semiconductor layer from which a carrier is drained;
   at least one channel bifurcated into branch conductive paths, a first end of said channel being connected to said first semiconductor layer to which a carrier is injected and a second end of said channel being connected to said second semiconductor layer from which a carrier is drained;
   at least one gate electrode arranged at a first side of said channel; and
   filtering means arranged between said first semiconductor layer and said channel for passing a carrier having a certain energy level to said channel.

2. A quantum interference type semiconductor device as set forth in claim 1, wherein said first semiconductor layer said filtering means, said channel, and said second semiconductor layer are laminated, respectively, on a semiconductor substrate.

3. A quantum interference type semiconductor device as set forth in claim 2, wherein said filtering means comprises a resonance tunneling barrier including a first barrier layer, a quantum well layer, and a second barrier layer.

4. A quantum interference type semiconductor device as set forth in claim 3, further comprising a common electrode arranged at a second side of said channel facing said gate electrode.

5. A quantum interference type semiconductor device as set forth in claim 1, wherein said channel is formed as parallel potential wells in a semiconductor heterostructure with a band discontinuity on the substrate made of mono-crystal, said filtering means and said first semiconductor layer being arranged, respectively, at a source side of said heterostructure, and said second semiconductor layer being arranged at a drain side of said heterostructure, wherein each of said bifurcated branch channels are made of an undoped semiconductor layer, wherein said channel is formed as a heterojunction including a layer having a smaller electron affinity than said channel and having a conductivity, and wherein a path for a carrier is formed around said heterojunction near said channel side.

6. A quantum interference type semiconductor device as set forth in claim 5, wherein said filtering means comprises a resonance tunneling barrier including a first barrier layer, a quantum well layer, and a second barrier layer.

7. A quantum interference type semiconductor device as set forth in claim 6, further comprising a common electrode arranged at a second side of said channel facing said gate electrode.

8. A quantum interference type semiconductor device as set forth in claim 7, wherein two gate electrodes are arranged at the first side of said channel and said two gate electrodes are ON/OFF controlled independently.

9. A quantum interference type semiconductor device as set forth in claim 8, wherein two channels are formed in said semiconductor heterostructure.

10. A quantum interference type semiconductor device as set forth in claim 1, wherein a center portion of said channel is bifurcated into branch conductive paths.

11. A quantum interference type semiconductor device using an Aharonov-Bohm effect comprising:
    a first semiconductor layer into which a carrier is injected;
    a second semiconductor layer from which a carrier is drained;
    at least one channel bifurcated into branch conductive paths, a first end of said channel being connected to said first semiconductor layer and a second end of said channel being connected to said second semiconductor layer;
    at least one gate electrode arranged at a first side of said channel; and
    filtering means arranged at said first side of said channel above said gate electrode along said channel for passing said carrier having a certain energy level below said channel.

12. A quantum interference type semiconductor device as set forth in claim 10, wherein said first semiconductor layer, said filtering means, said channel, and said second semiconductor layer are laminated, respectively, on a semiconductor substrate, wherein each of said bifurcated branch channels are made of an undoped semiconductor layer, wherein said channel is formed as a heterojunction including a layer having a smaller electron affinity than said channel and having a conductivity, and wherein a path for a carrier is formed around said heterojunction near said channel side.

13. A quantum interference type semiconductor device as set forth in claim 12, wherein said filtering means comprises a resonance tunneling barrier including a first barrier layer, a quantum well layer, and a second barrier layer.

14. A quantum interference type semiconductor device as set forth in claim 13, further comprising a common electrode arranged at a second side of said channel facing said gate electrode.

15. A quantum interference type semiconductor device as set forth in claim 11, wherein said channel is formed as parallel potential wells in a semiconductor heterostructure having a band discontinuity on the substrate made of mono-crystal, said filtering means and said first semiconductor layer being arranged, respectively, at a source side of said heterostructure, and said second semiconductor layer being arranged at a drain side of said heterostructure.

16. A quantum interference type semiconductor device as set forth in claim 15, wherein said filtering means comprises a resonance tunneling barrier including a first barrier layer, a quantum well layer, and a second barrier layer.

17. A quantum interference type semiconductor device as set forth in claim 16, further comprising a common electrode arranged at a second side of said channel facing said gate electrode.

18. A quantum interference type semiconductor device as set forth in claim 15, wherein gate electrodes are arranged at said first and second sides of said channel and said gate electrodes are ON/OFF controlled independently.

19. A quantum interference type semiconductor device as set forth in claim 18, wherein two channels are formed in said semiconductor heterostructure.

20. A quantum interference type semiconductor device as set forth in claim 11, wherein a center portion of said channel is bifurcated into branch conductive paths.

* * * * *

UNITED STATES PATENT AND TRADEMARK OFFICE
CERTIFICATE OF CORRECTION

PATENT NO. : 5,130,766
DATED : JULY 14, 1992
INVENTOR(S) : HIROSHI ARIMOTO ET AL.

It is certified that error appears in the above-identified patent and that said Letters Patent is hereby corrected as shown below:

TITLE PAGE [56] ABSTRACT
        line 12, "legvel" should be --level--.

Col. 3,   line 45, "(☐)" should be --([ ])--.

Col. 6,   line 32, "34 made" should be --34 denotes a drain electrode, electrodes 34 and 37 are made--;
           line 33, "material" should be --material,--.

Signed and Sealed this

Tenth Day of August, 1993

Attest:

MICHAEL K. KIRK

*Attesting Officer*     *Acting Commissioner of Patents and Trademarks*